US010326909B2

(12) United States Patent
Schlumm et al.

(10) Patent No.: US 10,326,909 B2
(45) Date of Patent: Jun. 18, 2019

(54) SELECTING COLORANT AMOUNT FOR PRINTING

(71) Applicant: HP INDIGO B.V., Amstelveen (NL)

(72) Inventors: Doron Schlumm, Kfar Harif (IL); Nir Mosenson, Ness Ziona (IL); Yohanan Sivan, Raanana (IL); Ziv Berkovich, Ness Ziona (IL)

(73) Assignee: HP Indigo B.V., Amstelveen (NL)

( * ) Notice: Subject to any disclaimer, the term of this patent is extended or adjusted under 35 U.S.C. 154(b) by 11 days.

(21) Appl. No.: 15/545,948

(22) PCT Filed: Apr. 10, 2015

(86) PCT No.: PCT/EP2015/057888
§ 371 (c)(1),
(2) Date: Jul. 24, 2017

(87) PCT Pub. No.: WO2016/162092
PCT Pub. Date: Oct. 13, 2016

(65) Prior Publication Data
US 2018/0020119 A1 Jan. 18, 2018

(51) Int. Cl.
G03F 3/10 (2006.01)
H04N 1/00 (2006.01)
H04N 1/40 (2006.01)
G03B 27/73 (2006.01)
H04N 1/401 (2006.01)

(52) U.S. Cl.
CPC ..... *H04N 1/40087* (2013.01); *H04N 1/00015* (2013.01); *H04N 1/4015* (2013.01); *G03B 27/735* (2013.01); *G03F 3/105* (2013.01)

(58) Field of Classification Search
None
See application file for complete search history.

(56) References Cited

U.S. PATENT DOCUMENTS

| 4,708,459 A | 11/1987 | Cowan et al. | |
|---|---|---|---|
| 4,745,420 A | 5/1988 | Gerstenmaier | |
| 5,170,261 A * | 12/1992 | Cargill | H04N 1/0402 347/252 |
| 5,369,497 A * | 11/1994 | Allen | H04N 1/4055 347/247 |
| 5,583,950 A * | 12/1996 | Prokoski | G06F 17/153 382/212 |

(Continued)

FOREIGN PATENT DOCUMENTS

CN 202378418 8/2012

OTHER PUBLICATIONS

Unknown, "Tech Tip 16 Measuring Ink Density", MacDermid Printing Solutions, Oct. 4, 2005, 6 pages.

*Primary Examiner* — Anh-Vinh T Nguyen
(74) *Attorney, Agent, or Firm* — HP Inc. Patent Department

(57) ABSTRACT

A method for selecting a colorant amount for printing is described in which a maximum optical density of an image is identified. The maximum optical density is compared to with a threshold optical density, and when the threshold is exceeded, dot cluster sizes from a first lookup table are selected, otherwise, dot cluster sizes from a second lookup table are selected. A colorant thickness corresponding to the selected dot cluster sizes is selected for printing the image.

13 Claims, 4 Drawing Sheets

(56) References Cited

U.S. PATENT DOCUMENTS

| | | | | |
|---|---|---|---|---|
| 5,949,966 | A * | 9/1999 | Hayashi | H04N 1/4105 358/1.9 |
| 6,252,678 | B1 * | 6/2001 | Shimizu | H04N 1/40087 347/184 |
| 6,317,220 | B1 * | 11/2001 | Fujita | H04N 1/4055 347/131 |
| 6,439,683 | B1 * | 8/2002 | Matsumoto | G06K 15/102 347/15 |
| 6,546,131 | B1 * | 4/2003 | Mizoguchi | H04N 1/4074 358/504 |
| 7,387,352 | B2 | 6/2008 | Florence et al. | |
| 2002/0030832 | A1 * | 3/2002 | Shibuya | H04N 1/6033 358/1.9 |
| 2007/0171247 | A1 * | 7/2007 | Kitagawa | H04N 1/4015 347/15 |
| 2007/0175998 | A1 * | 8/2007 | Lev | G06K 9/6203 235/454 |
| 2009/0073509 | A1 * | 3/2009 | Shoda | G06K 9/38 358/474 |
| 2009/0130313 | A1 * | 5/2009 | Ohshima | B41M 5/0023 427/288 |
| 2009/0244575 | A1 * | 10/2009 | Sasayama | H04N 1/4015 358/1.9 |
| 2011/0194162 | A1 | 8/2011 | Nakaso et al. | |
| 2012/0236328 | A1 | 9/2012 | Ohnishi | |
| 2013/0187968 | A1 | 7/2013 | Cofler | |

* cited by examiner

SELECTING COLORANT AMOUNT FOR PRINTING

BACKGROUND

Colorants that generally adhere to the surface of substrates, e.g. paper or plastic, with little or no penetration into the substrates are used in various printing processes and presses. Each area on the final output, i.e. the printed substrate, may include clusters of colorant dots that cover a percentage of the area. The rest of the area may remain clear, i.e. it may not be covered by colorant. The number of dots per cluster attributes to the resolution of the printed image. The optical density of the image may be controlled by controlling the percentage the dots occupy on the specific area. A 100% occupation implies a cluster where the dots occupy the space of the entire area, i.e. there remains no clear area. For the same colorant, a lower percentage occupation results in lower optical density compared to a higher percentage occupation that results in higher optical density.

BRIEF DESCRIPTION

Some non-limiting examples will be described in the following with reference to the appended drawings, in which.

DETAILED DESCRIPTION

When a printing press is calibrated, the cluster's thickness, i.e. the height the colorant may reach on the substrate, is determined based on the maximum theoretical optical density achieved with 100% occupation. Thereafter, a desired optical density of each area (up to the maximum optical density) may be achieved by selecting a percentage occupation (between 0% and 100%) that corresponds to the desired optical density. However, the thickness of the colorant remains the same for all clusters and for the entire image. Even for areas with low optical density (i.e. light color areas on the image), the printed cluster shall have the same colorant thickness but low percentage occupation. However, in the majority of images, the maximum desired optical density of any area of the image does not approach the maximum theoretical optical density. That means that occupation percentages close to the 100% occupation are rarely encountered.

Figure 1A:
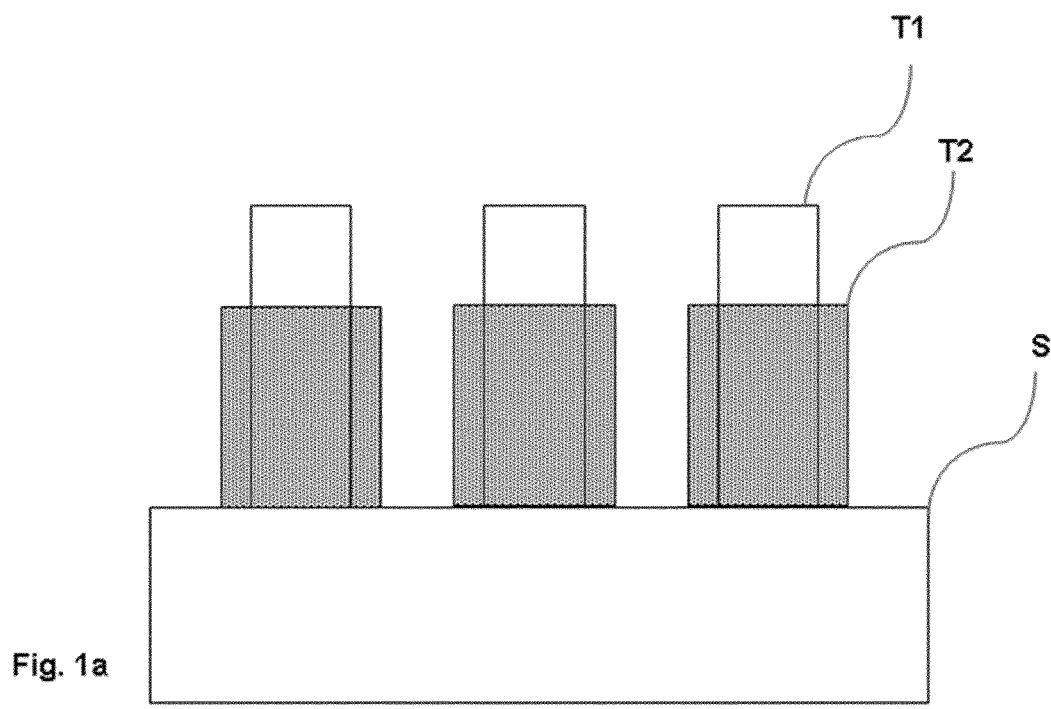
FIG. 1 shows an area with different cluster sizes and colorant thicknesses for the same optical density.
Figure 1B:
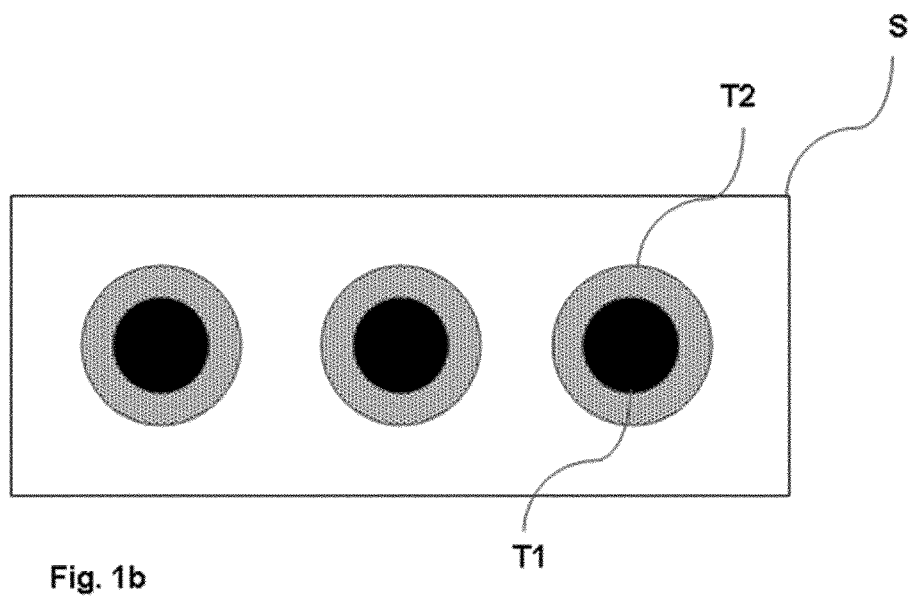

It is possible to achieve the same optical density with two (or more) distinct percentage occupations and respective distinct colorant thicknesses. FIGS. 1a and 1b shows a side view and top view, respectively, of an area where the same optical density is achieved with different cluster sizes and colorant thicknesses. Area S is shown printed with two percentage occupations that both may achieve the same optical density. The thickness of the cluster T2 with the higher percentage occupation is lower compared to the thickness of the cluster T1. When a lower thickness is used, the colorant saving may be defined by the equation:

$$C_S = 1 - (OD_R/OD_O) * C_A$$

$C_S$ is the total colorant saving, $OD_R$ is the Optical Density of the area with 100% occupation using the lower thickness, $OD_O$ is the Optical Density of the area using 100% occupation with the higher thickness, and $C_A$ is the amount of colorant used due to the cluster size increase. $C_A$ corresponds to the colorant included in the grayed area of FIG. 1b. It is noted that it may not be possible to apply the lower thickness colorant if the optical density in the image to be printed exceeds the $OD_R$.

Figure 2:
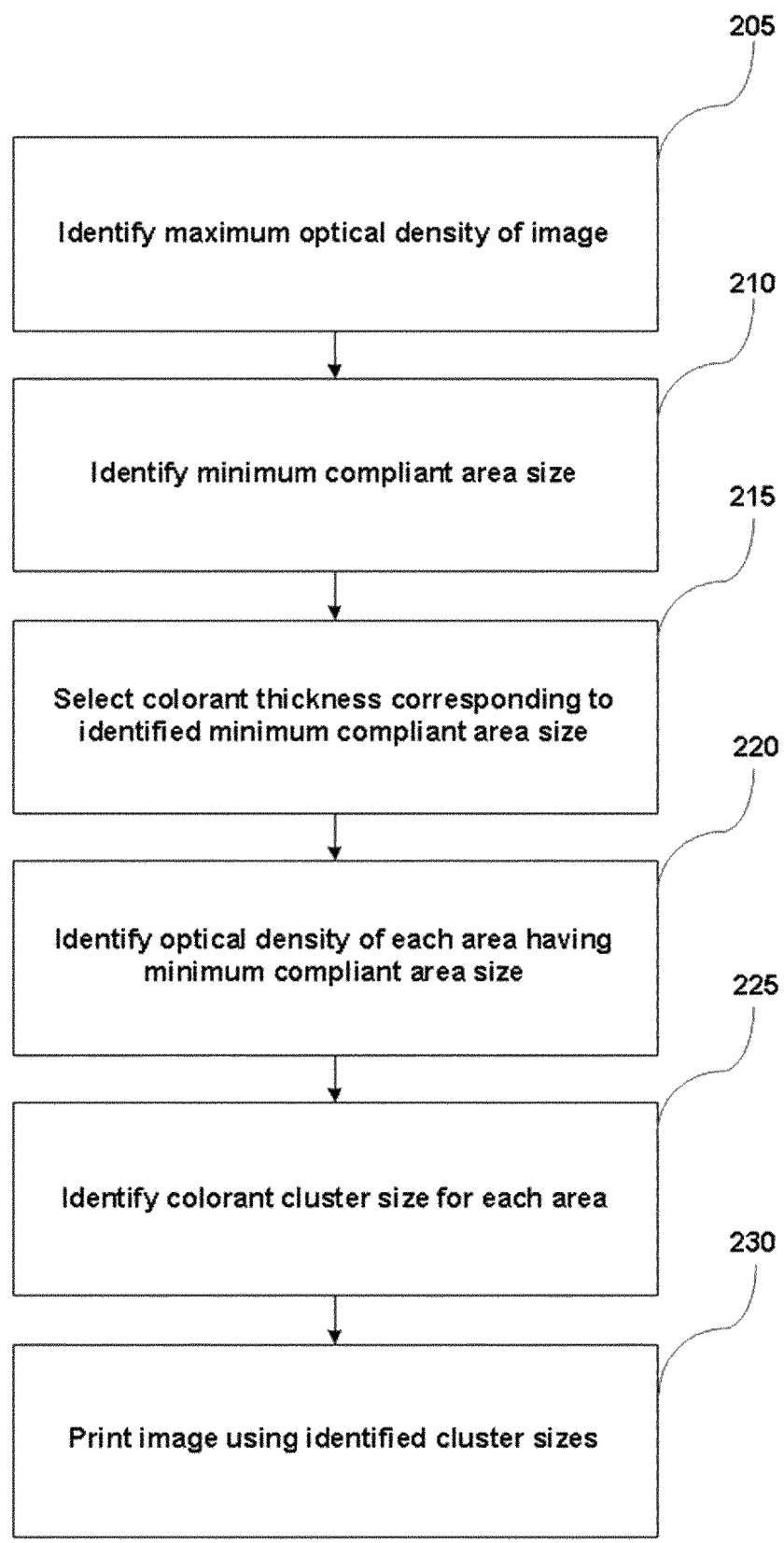
FIG. 2 illustrates a flow diagram of a method for printing an image on a print medium according to an example.

FIG. 2 illustrates a flow diagram of a method for printing on a print medium according to an example. In block 205 a maximum optical density of the image may be identified. If the maximum optical density of the image approaches the maximum theoretical optical density achievable by the printing press, i.e. if an area of the image requires a percentage occupation close to 100%, then no action may be taken and printing may resume with default values. When this is not the case, a minimum compliant area size may be identified in block 210. The minimum compliant area size may be the smaller size where all areas of the image having a size equal to that size may have an average optical density up to the identified maximum optical density of the image. That is, no average optical density of any area having a size equal to that size may exceed the identified maximum optical density. To identify the minimum compliant area size, a number of area sizes may be selected. Using smaller area sizes may pose a higher risk of detecting an average optical density of a selected area that exceeds the identified maximum optical density of the image. However, smaller area sizes may allow a lower colorant thickness and thus a higher colorant saving. As the selected area size increases, the possibility of detecting an average optical density of an area that is higher than the identified maximum density of the image may decrease, but this may also be the case for the colorant saving as they may allow a higher, comparatively, colorant thickness to that of the smaller area sizes.

For example, in an image, the maximum identified optical density may be found to have a value of 1.25 for a specific color. It may then be found that various area sizes may be allowable. For example, an area size of 8×8 mm may allow a first colorant thickness with colorant cluster size having a percentage occupation of 80% to achieve the 1.25 value; an area size of 4×4 mm may allow a second colorant thickness, lower than the first colorant thickness, with colorant cluster size having a percentage occupation of 90% to achieve the 1.25 value; and an area size of 2×2 mm may allow a third colorant thickness, lower than the second colorant thickness, with colorant cluster size having a percentage occupation of 95% that may achieve the 1.25 value. The 2×2 mm area size may thus be identified as the minimum compliant area size.

In another example, where the maximum optical density of the image may be found to exceed the 1.25 value but not the 1.35 value, the 2×2 mm area size may not be a compliant area size. Therefore, in that case the area size of 8×8 mm may allow a first colorant thickness with colorant cluster size having a percentage occupation of 90% to achieve the 1.35 value and the area size of 4×4 mm may allow a second colorant thickness, lower than the first colorant thickness, with colorant cluster size having a percentage occupation of 98% to achieve the 1.35 value. As a consequence, the 4×4 mm area size may be identified as the minimum compliant area size that may provide the minimum colorant thickness and, thus, the maximum colorant saving.

In one example, the identification of the minimum compliant area size may be implemented by blurring the image. Various blurring masks of different size may be used to identify the minimum compliant area size. That is, starting from a smaller blurring mask and increasing the size of the blurring mask until no pixel of the blurred image may have an optical density higher than the maximum optical density of the image. However, any other technique may be used to identify the minimum compliant area size.

The average optical density and the maximum optical density may belong to an average optical density range and a maximum optical density range, respectively. The minimum compliant area size may correspond to the largest area where a trained human eye may not distinct between two optical densities with values within the average optical density value range.

When the minimum compliant area size is identified, then, in block 215, a colorant thickness corresponding to the identified minimum compliant area size may be selected. The colorant thickness may be lower than the default thickness. In block 220, the optical density of each area of the image having the identified minimum compliant area size may then be identified. For each area of the image having the minimum compliant area size and for the selected colorant thickness a colorant cluster size may then be identified in block 225. There are two options: either the colorant cluster size may be selected corresponding to the new selected colorant thickness, thereby having a percentage occupation higher than the default one would be if the default colorant thickness were used; or the colorant cluster size may be identified in the default colorant thickness and a correspondence table may give the actual percentage occupation for the lower thickness.

This may depend on the implementation of the method. In example implementations the analysis of the image may be implemented externally to the printing press, at an image processing station, and the printing press may simply receive instructions including the selected colorant thickness and the corresponding colorant cluster sizes for each area of the image. In other example implementations the printing press may calculate the colorant thickness and corresponding colorant cluster sizes based on the maximum optical density of the image. Finally, in block 230, the image may be printed using the identified cluster sizes.

The image may be separated in various channel images, one for each basic color. In some implementations, such as in some HP Indigo Digital Presses, the basic colors may be up to seven. However, any number of channels may be used, one corresponding to each color, according to the specifications of the printing press. The process may then be repeated for each of the basic colors and each of the channel images. When an image is received, either at the printing press or at the image processing station, it may be separated in the channel images. Then each channel image may be blurred (or smoothed) with a specific window. The average optical density for each area may then be defined and the maximum compliant area size may be identified for each channel.

Figure 3:
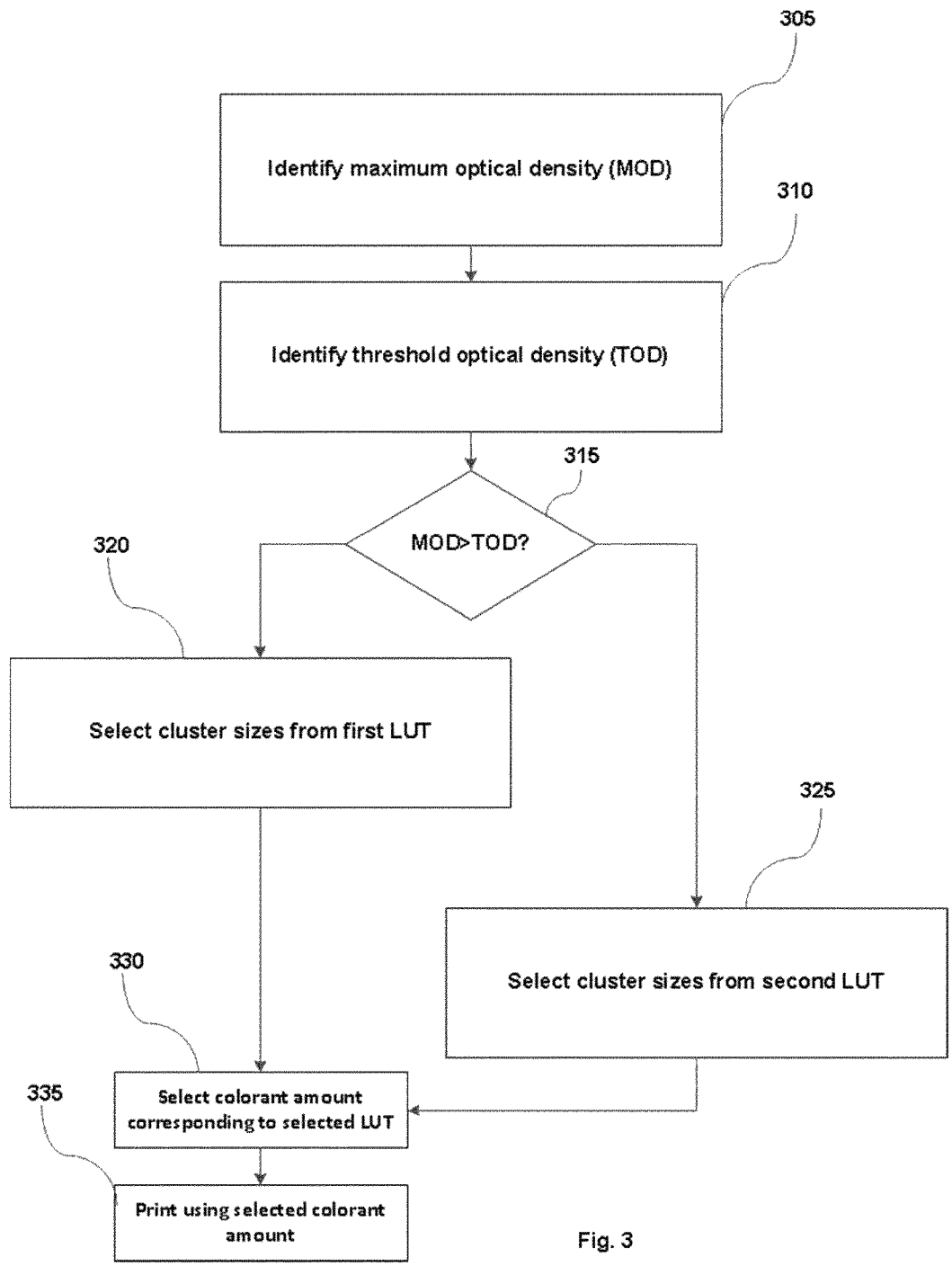
FIG. 3 illustrates a flow diagram of a method for selecting a colorant amount for printing according to an example.

FIG. 3 illustrates a flow diagram of a method of selecting a colorant amount for printing in a printing press. In block 305 a maximum optical density of an image may be identified. That means that an area with the maximum optical density may be detected. In block 310 a threshold optical density is identified. The threshold optical density may be equal to $OD_R$, i.e. the optical density of the area with 100% occupation using the lower thickness clusters. In block 315 it may be checked if the identified maximum optical density exceeds the threshold optical density. It is noted that in some implementations the thickness of the colorant may be set for the whole image after the minimum compliant area size is determined. In other implementations, the maximum optical density may be identified in contiguous areas of the image (e.g. lines) and the thickness may be modifiable per contiguous area of the image. Now, in block 320, cluster sizes from a first lookup table (LUT) may be selected when the identified maximum optical density exceeds the threshold optical density. In block 325, cluster sizes from a second lookup table may be selected when the identified maximum optical density does not exceed the threshold optical density. The first lookup table may include percentage occupations and respective colorant thickness for optical densities up to the $OD_O$ value, that is, optical density of the area with 100% occupation with the higher thickness. The second lookup table may include percentage occupations and respective colorant thickness for ODs up to the $OD_R$ value, that is, optical density of the area with 100% occupation with the lower thickness. A first colorant amount may be associated with a first cluster size set and a second colorant amount may be associated with a second cluster size set. The size of clusters in the second cluster set may be higher than the size of clusters in the first cluster set for the same optical density. Accordingly, the second colorant amount may be lower than the first colorant amount. In some implementations, the printing press may include more than two lookup tables and select between them. In yet other implementations the $OD_R$ value may be defined as a function of the maximum identified optical density and the lookup table may be calculated on the fly for the received image or image channel. In block 330 the colorant amount, i.e. the thickness of the colorant when printed on the substrate, that corresponds to the selected cluster sizes may be selected. In block 330, the printing press may then print based on the selected cluster sizes and corresponding selected colorant amount.

Figure 4:
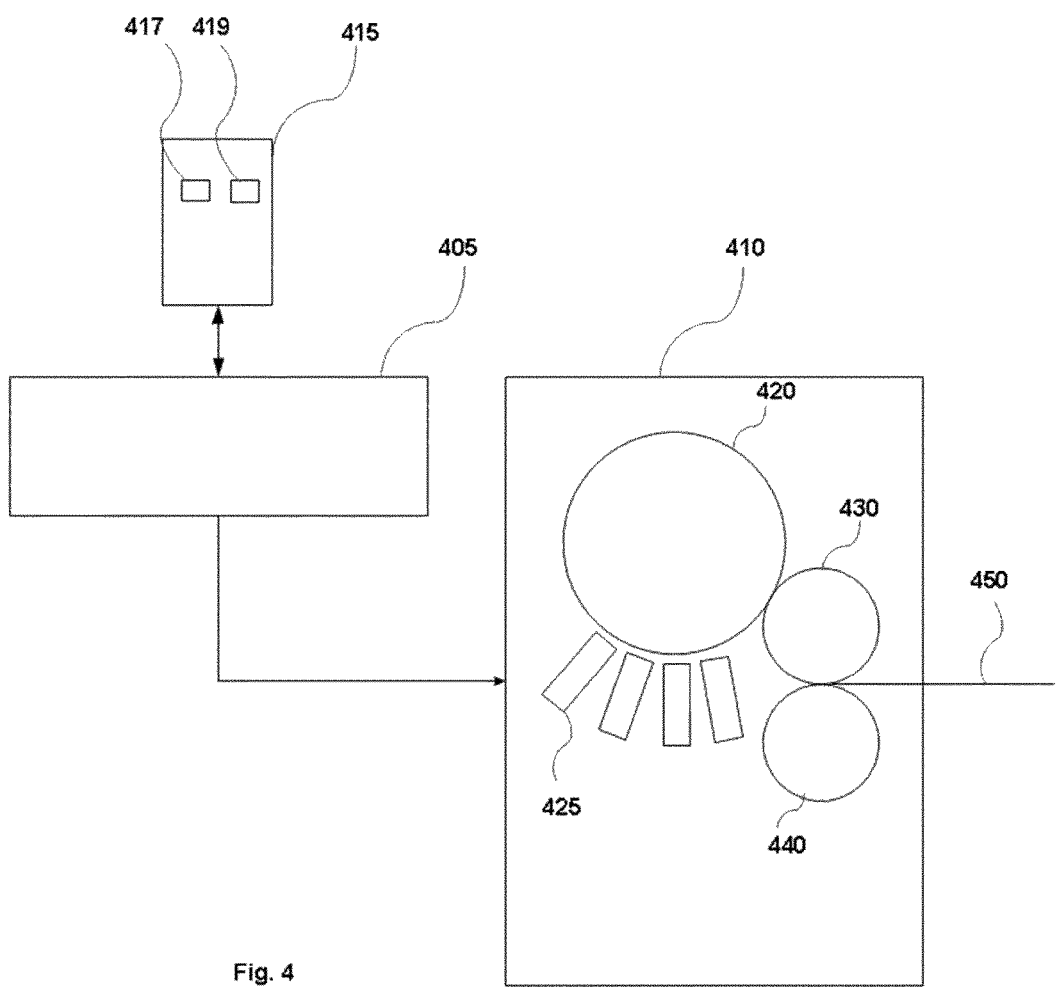
FIG. 4 illustrates a block diagram of a printing press according to an example.

FIG. 4 is a block diagram of a printing press according to an example. Printing press 400 may comprise a controller 405 and an image forming unit 410. The controller 405 may receive an image from an input interface of the printing press, process the image to identify a maximum optical density of an area of the image and select between a standard colorant amount and at least one reduced colorant amount. The standard colorant amount may correspond to a predetermined cluster size table 417 and the at least one reduced colorant amount may correspond to at least one increased cluster size table 419, respectively. The printing press may further comprise a memory 415 to store the predetermined cluster size table 417 and the corresponding standard colorant amount, and at least one increased cluster size table 419 and the corresponding at least one reduced colorant amount. The image forming unit 410 may receive the selected colorant amount and cluster size table and print the image on a print medium 415 based on the received selected colorant amount and respective cluster size table. Alternatively or additionally the printing press may further comprise a processing module to calculate the increased cluster table and the corresponding reduced colorant amount based on the stored predetermined cluster size table, the corresponding standard colorant amount and the maximum identified optical density of the image to be printed.

The printing press may be any type of press where colorants are not dissolved in the print medium during or after printing. For example, the printing press may be an electrophotography press, e.g. a liquid electrophotography press, or an offset press. The printing press may comprise colorant applicators 425 comprising colorant, an imaging member 420 having a surface to form a latent image of the received image thereon, and a transfer member 430. The colorant applicators 425 may receive the selected colorant amount and apply the corresponding colorant volume on the imaging member 420 to generate a colorant image on the imaging member 420. The intermediate transfer member 430 may receive the colorant image from the imaging member 420 and transfer the colorant image to the print medium 450. The print medium may be pressed against the intermediate transfer member 430 by an impression member 440.

In electrophotography presses, the imaging member 420 may be a photoconductive member and the colorant applicators 425 may be binary ink developers (BIDs). The intermediate transfer member 430 may be an image transfer blanket. The impression member 430 may be an impression cylinder.

In offset presses, the imaging member 420 may be an offset plate of a plate cylinder and the colorant applicators 425 may be ink rollers. The intermediate transfer member 430 may be a blanket of an offset cylinder. The impression member 440 may also be an impression cylinder.

It is noted that images printed according to examples disclosed herein may be indistinguishable to images printed using the default colorant amounts. In order to identify that an image has been printed according to examples herein, a comparison between two similar images may be employed where one image includes an area with an optical density approaching the $OD_O$ and another image that doesn't include such an area. If the printing press has been printed according to examples herein, then the image with the $OD_O$ will be printed using the higher colorant thickness while the other image will be printed using the lower colorant thickness. Subsequent thickness measurements may, therefore, not be consistent something that would indicate usage of examples as disclosed herein.

A similar comparison may be made at a press level by measuring the amount of colorant consumed. That is, by comparing the colorant consumed for the one image and for the other. A lower colorant consumption that may not be attributed merely to the area with an optical density approaching the $OD_O$ may be an indication of usage of examples disclosed herein for printing images.

The invention claimed is:

1. A method for printing an image on a print medium, comprising:
   identifying a minimum compliant area size, as a smallest size area into which the image is divisible into areas that each have an optical density no greater than a threshold optical density for the image, the minimum compliant area size having a lowest colorant thickness at which the threshold optical density is achievable within each area of the image of the smallest size area, minimizing colorant usage to achieve the threshold optical density;
   identifying a colorant cluster size, based on the minimum compliant area size and the lowest colorant thickness;
   printing the image on the print medium using the identified cluster size.

2. The method according to claim 1, wherein identifying the minimum compliant area size comprises blurring the image using blurring masks of different sizes.

3. The method according to claim 2, wherein identifying the minimum area size comprises:
   selecting a candidate area size;
   dividing the image into candidate areas that each have the candidate area size;
   comparing an optical density of each candidate area of the image to the threshold optical density;
   increasing the size candidate area size until the optical density of all candidate areas having the candidate area size falls below the threshold optical density.

4. A method for selecting a colorant amount for printing, comprising:
   identifying a maximum optical density of any area of an image having a minimum compliant area size, the minimum compliant area size being a smallest size area into which the image is divisible into areas that each have an optical density no greater than a first threshold optical density for the image, the minimum compliant area size having a lowest colorant thickness at which the first threshold optical density is achievable within each area of the image of the smallest area size, minimizing colorant usage to achieve the first threshold optical density;
   comparing the identified maximum optical density of any area having the minimum compliant area size with a second threshold optical density;
   selecting cluster sizes for areas of the image having the minimum compliant area size from a first lookup table when the identified maximum optical density of any area having the minimum compliant area size exceeds the second threshold optical density;
   selecting cluster sizes for the areas from a second lookup table when the identified maximum optical density of any area having the minimum compliant area size does not exceed the second threshold optical density;
   selecting colorant amounts that corresponds to the selected cluster sizes;
   printing the image using the selected colorant amounts.

5. The method according to claim 4, wherein the first lookup table is associated with a first colorant amount and the second lookup table is associated with a second colorant amount.

6. The method according to claim 5, wherein the first colorant amount is associated with a first cluster size set and the second colorant amount is associated with a second cluster size set.

7. The method according to claim 6, wherein the size of clusters in the second cluster set is higher than the size of clusters in the first cluster set for the same optical density and the second colorant amount is lower than the first colorant amount, respectively.

8. A printing press, comprising:
   a controller to:
     receive an image;
     identify a maximum optical density of any area of the image having a minimum compliant area size, the minimum compliant area size being a smallest size area into which the image is divisible into areas that each have an optical density no greater than a first threshold optical density for the image; and
     based on the maximum optical density of any area of the image having the minimum compliant area size, select between a standard colorant amount and at least one reduced colorant amount, wherein the standard colorant amount corresponds to a predetermined colorant cluster size table and the at least one reduced colorant amount corresponds to at least one increased cluster size table, respectively;
   an image forming unit, to receive the selected colorant amount and respective cluster size table and print the image on a print medium based on the received colorant amount and respective cluster size table.

9. A printing press according to claim 8, further comprising a memory to store:

the predetermined colorant cluster table and the respective standard colorant amount, and the at least one increased cluster tables and the respective reduced colorant amounts.

10. A printing press according to claim 8, further comprising a memory to store the predetermined colorant cluster table and the respective standard colorant amount, and a processing module to calculate the at least one colorant cluster table and the corresponding reduced colorant amounts based on the stored predetermined colorant cluster table, the corresponding standard colorant amount and the identified maximum optical density of the image.

11. A printing press according to claim 8, wherein the image forming unit further comprises:

colorant applicators comprising colorant, an imaging member having a surface to form a latent image of the received image thereon, and a transfer member, wherein, the colorant applicators are to receive the selected colorant amount and apply the corresponding colorant volume on the imaging member to generate a colorant image on the imaging member, the intermediate transfer member is to receive the colorant image from the imaging member and transfer the colorant image to the print medium.

12. A printing press according to claim 11, wherein the printing press is an electrophotography press.

13. A printing press according to claim 11, wherein the printing press is an offset press.

\* \* \* \* \*